(12) United States Patent
Page

(10) Patent No.: US 6,714,071 B1
(45) Date of Patent: Mar. 30, 2004

(54) GATE MODULATION FOR HIGH POWER AMPLIFIERS

(75) Inventor: Trevor A. Page, Airdrie (CA)

(73) Assignee: Nortel Networks Limited, Richardson, TX (US)

( * ) Notice: Subject to any disclaimer, the term of this patent is extended or adjusted under 35 U.S.C. 154(b) by 28 days.

(21) Appl. No.: 09/888,823

(22) Filed: Jun. 25, 2001

(51) Int. Cl.[7] ................................................. H03G 3/20
(52) U.S. Cl. ........................ 330/136; 330/140; 330/285; 455/127; 375/297
(58) Field of Search ................................. 330/136, 140, 330/285; 455/127; 375/297

(56) References Cited

U.S. PATENT DOCUMENTS

| | | | | |
|---|---|---|---|---|
| 5,420,536 A | * | 5/1995 | Faulkner et al. ............. | 330/285 |
| 5,471,656 A | * | 11/1995 | Kusunoki ..................... | 330/136 |
| 5,920,596 A | * | 7/1999 | Pan et al. ..................... | 330/136 |

FOREIGN PATENT DOCUMENTS

JP      54104760    *   8/1979

OTHER PUBLICATIONS

Kelly et al. "LMST—the Lightweight Multibai Satellite Communications Terminal" Milcom '94 Military Communications Conference, Oct. 2–5, pp 511–516 vol 2.*

* cited by examiner

Primary Examiner—Michael B. Shingleton
(74) Attorney, Agent, or Firm—Schwegman, Lundberg, Woessner & Kluth, P.A.

(57) ABSTRACT

A high power RF amplifier utilizes dynamic biasing for transistors in an output stage of the amplifier. In one embodiment, as the magnitude of an RF signal to be amplified falls below a predetermined level, the biasing signal is turned off to reduce power consumption. A gate bias voltage is used to switch the transistors off and on. A low pass filter is employed to eliminate noise generated at the output of the amplifier caused by the instantaneous switching, while not impacting the amplifier's response to low-high magnitude transients. In a further embodiment, I and Q data from baseband digital data is sampled and buffered prior to being transformed and provided to a RF power amplifier. A gate bias signal is controlled based on current samples in order to control the power amplifier in a manner appropriate for the current samples when provided from the buffer.

13 Claims, 2 Drawing Sheets

GATE MODULATION FOR HIGH POWER AMPLIFIERS

FIELD OF THE INVENTION

The present invention relates to high power amplifiers, and in particular to gate modulation of high power amplifiers for efficient operation.

BACKGROUND OF THE INVENTION

Telecommunications base stations use ultra linear radio frequency (RF) high power amplifiers for transmitting signals to remote communication devices such as cellular telephones. The amplifiers use transistors to amplify RF signals for transmission. The requirement of ultra high linearity dictates that the transistors be biased electrically in such a way that minimal distortion is imposed upon the amplified signal. Unfortunately, such biasing results in the transistor(s) requiring continuous electrical power, even when the magnitude of the signal to be amplified is zero.

Current high power amplifier designs for use in Code Division Multiple Access (CDMA) base stations have an efficiency of approximately 13% when operating at maximum rated output power. This low efficiency results in the need to disperse heat generated by the excess power consumed. It also results in base station packaging being physically large, complex and costly.

There is a need to reduce the power consumption of high power amplifiers without affecting the linearity of the amplification. There is a further need to reduce the need for large, complex and costly packaging for RF high power amplifiers caused by excess heat generation.

SUMMARY OF THE INVENTION

A high power RF amplifier utilizes dynamic biasing for transistors in an output stage of the amplifier. In one embodiment, as the magnitude of an RF signal to be amplified falls below a predetermined level, the biasing signal is turned off to reduce power consumption. A gate bias voltage is used to switch the transistors off and on. A low pass filter is employed to eliminate noise generated at the output of the amplifier caused by the instantaneous switching, while not impacting the amplifier's response to low-high magnitude transients.

In a further embodiment, I and Q data from baseband digital data is sampled and buffered prior to being transformed and provided to a RF power amplifier. A gate bias signal is controlled based on current samples in order to control the power amplifier in a manner appropriate for the current samples when provided from the buffer. If the current sample and next samples are less than a threshold, the gate bias is removed. If the current sample and next samples are greater than the threshold, the gate bias is present.

DETAILED DESCRIPTION OF THE INVENTION

Figure 1:
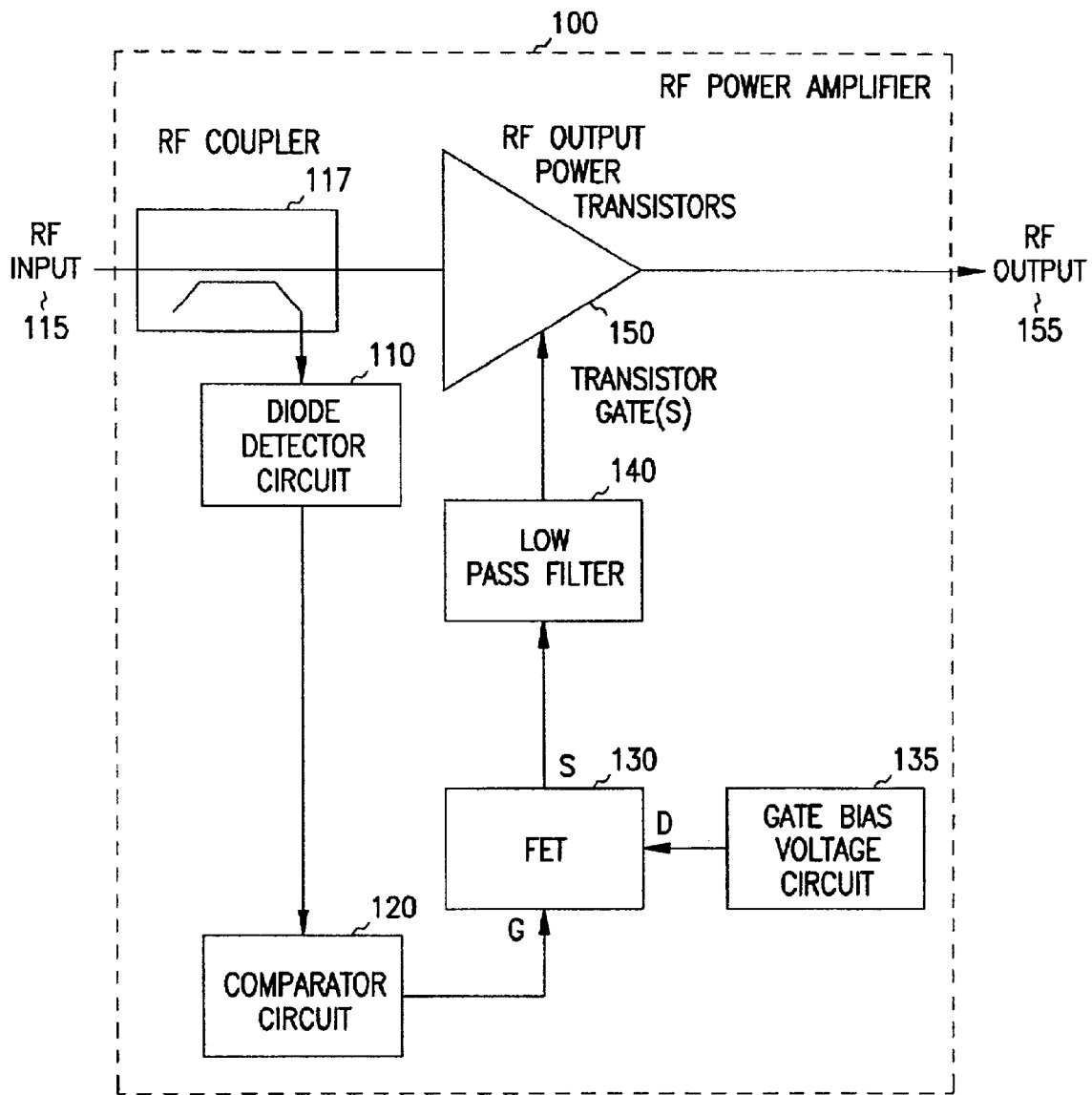
FIG. 1 is a block diagram of dynamic biased transistors in the output stages of an RF power amplifier in accordance with the present invention.

A radio frequency (RF) power amplifier is indicated generally at 100 in FIG. 1. A diode detector 110 samples the envelope of a Code Division Multiple Access (CDMA) input waveform 115. The diode detector 110 converts the RF signal into a voltage which is a function of the magnitude of the envelope of the RF signal. It produces a voltage that is related to the magnitude of the envelope of the RF input signal 115. An RF coupler 117 is coupled between the RF input 115 and the diode detector circuit 110 to provide a relatively non-invasive means of sampling the voltage of the input signal.

The output of the diode detector 110 is coupled to a comparator 120, which switches a gate bias control FET 130 which is biased by a gate bias voltage circuit 135. The comparator 120 compares the output of the diode detector circuit with a threshold voltage level. If the output of the diode detector falls below the threshold voltage, then the output of the comparator changes state, either from low-to-high, or high-to-low, in different embodiments.

FET 130 provides a switched path for the gate bias supply voltage provided by circuit 135. Normally, a gate bias supply voltage is optimized for a particular application referred to as setting the operating point of the transistors. Changes in the gate bias level typically cause changes in gain, linearity, and quiescent DC current, and ultimately the temperature of the function, which in turn affects gain and linearity. It is desirable to keep the gate bias voltages relatively static. In some applications, a small change in gate bias over temperature may be required to compensate for temperature effects. Gate bias circuit 135 in one embodiment is a regulated DC supply that provides a low-noise voltage source. It comprises an integrated voltage regulator, a potentiometer for precise trimming of the voltage, and a selection of capacitors for filtering.

The gate terminal of the FET is coupled to the comparator circuit 120, the drain terminal of the FET is coupled to the gate bias voltage circuit, and the source terminal of the FET is coupled to the low pass filter 140. In this embodiment, when the FET 130 is switched on by the comparator, a low impedance path is formed between its drain and source terminals. When the FET 130 is switched off, a high impedance path exists. The potential different between the gate and source terminals of the FET determine the impedance between its source and drain terminals.

A low pass filter 140 is coupled to the output of the FET 130 to avoid unwanted spurious emissions caused by sudden switching of the gate of the FET 130. Low pass filter 140 attenuates high frequency components of the gate bias voltage signal, which is switched by the FET. When the FET switches on or off, the gate bias voltage signal is essentially a step function, which has some energy at all frequencies. Therefore, a low pass filter, such as an R-C network, ensures that any high frequency components generated by the switching are attenuated sufficiently, before being delivered to the gates of output power transistors 150. The output power transistors 150 provide an RF output 155.

In one embodiment, the threshold voltage is set using empirical test data. It is difficult to reliably predict or to have knowledge of the (envelope of the) RF signal, which is about to be delivered to the amplifier. Therefore, the threshold voltage is set conservatively, and some hysteresis is employed to ensure that the gate bias is always restored when the magnitude of the envelope of the RF input signal exceeds a certain value.

Figure 2:
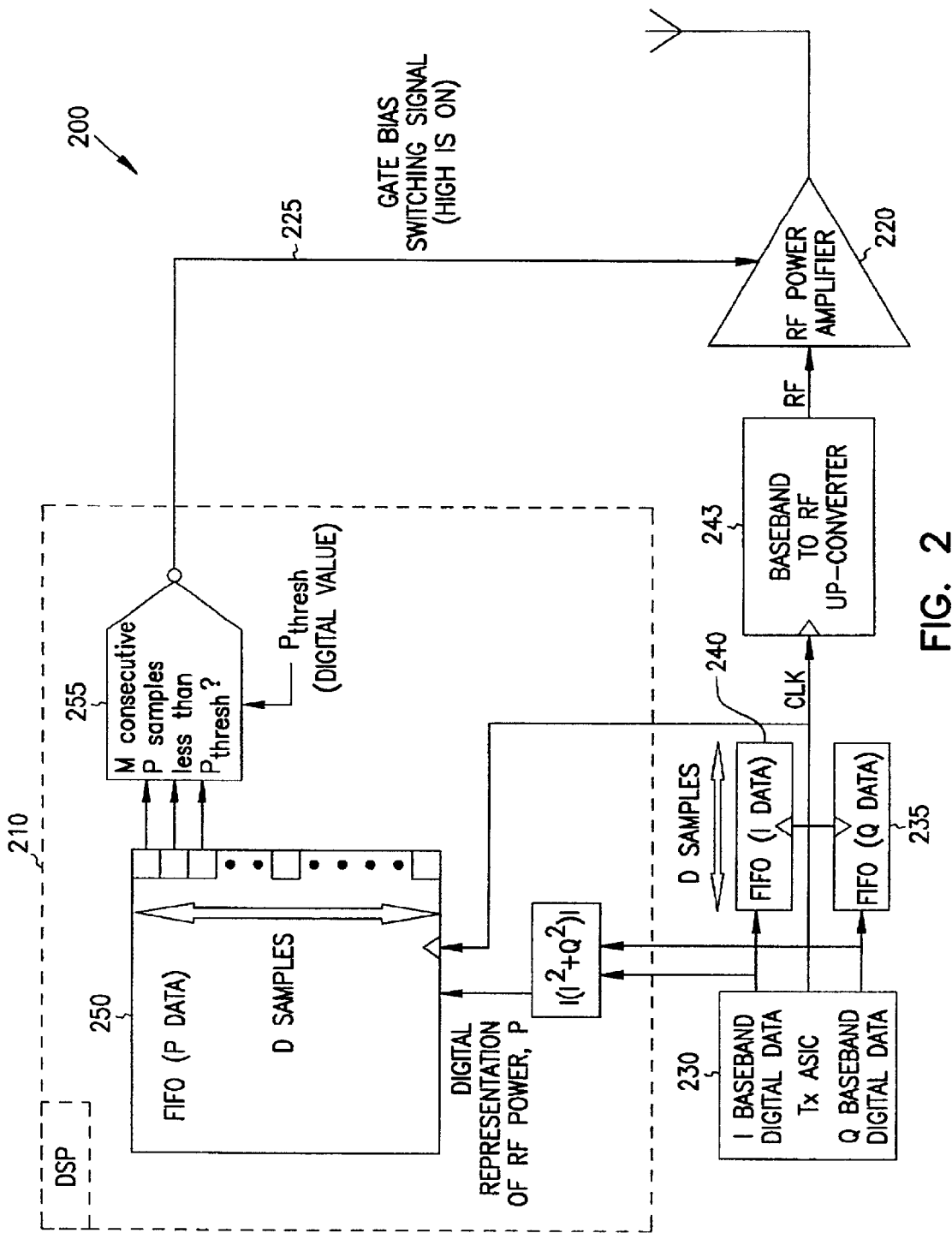
FIG. 2 is a block diagram of a further embodiment of the RF power amplifier of FIG. 1.

In a further embodiment shown in FIG. 2, a "digital baseband in" system is shown generally at 200. A gate switching system 210 generates a Gate bias switching signal by sampling digital baseband I and Q data, and provides it to gates of an RF power amplifier 220 via line 225.

I and Q data is streamed from the output of a Tx ASIC 230, together with a Tx clock which is normally used to clock Tx DACs inside an upconverter. The I and Q data is fed through two separate FIFO buffers 235 and 240, which act as digital delays to a baseband to RF up-converter 243 which provides RF signals to the RF power amplifier 220. Both FIFO buffers hold D samples.

Prior to these two FIFO buffers, I and Q digital baseband data is converted into a digital representation of RF power, by applying a formula such as $P=|(I^2+Q^2)|$ at 245 in gate switching system 210. The continuous stream of P values are fed into a P FIFO buffer 250, also of length D samples, which offers non-invasive, parallel access. The P FIFO buffer 250 therefore contains a representation of RF power vs. time. A minimum value of M must be predetermined for the particular application by consideration at least the following factors; the time constant of low pass filter 140, $\tau$, the rate at which baseband data is processed, $F_s$.

In general, a value of M should be chosen such that $M^- > 2\tau F_s$, thus ensuring that low pass filter 140 may discharge and recharge significantly during the time period that the gate bias switching signal 225 is a logic low. The value of D in one embodiment is greater than or equal to M.

The last M values of the P FIFO buffer 250 are sampled, and if they are all less than a Pthreshold value, $P_{thresh}$, which is a digital representation of RF power derived from the I and Q baseband signals, then, as determined at comparator logic 255, a logic low is generated, otherwise a logic high is generated. This logic signal is fed to the Gate bias switch control input of the RF Power Amplifier 220. The Gate bias switching signal will be zero, and therefore the Gate bias of the RF power amplifier will be removed if; the current sample and next (M−1) samples of P are less than $P_{thresh}$. The Gate bias switching signal will be one, and therefore the Gate bias of the RF power amplifier will be present if; either the current sample, or any of the next (M−1) samples of P are greater than or equal to $P_{thresh}$. $P_{thresh}$ is determined empirically in one embodiment to obtain a desired tradeoff between power conservation and performance. In further embodiments, $P_{thresh}$ is set such that a maximum amount of power is conserved without degradation of performance.

The invention can be used for any amplifier application where the modulation scheme dictates that the magnitude of the envelope of the RF signal regularly approaches zero. Regardless of the modulation scheme, a high power linear amplifier consumes considerably less power in cases where the RF input signal is removed. The thresholds for turning the power amplifier on and off are approximate, and may be used in a manner such that switching occurs when the signal being compared is equal to, less then, or greater than as desired.

What is claimed is:

1. A method of controlling an RF power amplifier comprising buffering an input signal comprising baseband digital data in a FIFO buffer:
   providing a bias signal to the RF power amplifier for normal operation;
   detecting the magnitude of the input signal to be amplified by the RF power amplifier buffering a digital representation of the magnitude of the input signal in a FIFO buffer; and
   changing the bias signal as a function of the input signal to reduce power consumption of the RF power amplifier wherein the bias signal is removed when the magnitude of the input signal reaches a predetermined threshold.

2. The method of claim 1 wherein the input signal is an RF signal.

3. The method of claim 1 wherein the threshold is a voltage threshold.

4. The method of claim 1 wherein the input signal is a digital baseband data.

5. The method of claim 1 wherein the bias signal is changed prior to the corresponding input signal being provided to the RF power amplifier.

6. The method of claim 1 and further comprising low pass filtering the bias signal prior to providing it to the RF power amplifier.

7. A RF power amplifier system comprising:
   a FIFO buffer for buffering baseband digital data;
   a FIFO buffer for buffering a digital representation of the power of the baseband digital data;
   a comparator for providing a bias signal to an RF power amplifier as a function of the digital representation of the power of the baseband digital data; and
   a converter for converting the baseband digital data to RF, and providing it to the RF power amplifier.

8. The RF power amplifier system of claim 7 wherein FIFO buffers are of equal size.

9. The RF power amplifier system of claim 7 wherein the digital representation of the power is compared to a threshold power.

10. The RF power amplifier system of claim 9 wherein the bias signal turns the RF power amplifier on when the digital represent of the power is greater than the threshold.

11. The RF power amplifier system of claim 9 wherein the bias signal turns the RF power amplifier off when M consecutive power samples are all less than a threshold power.

12. A method of controlling a RF power amplifier system, the method comprising:
   buffering baseband digital data in a FIFO buffer;
   buffering a digital representation of the power of the baseband digital data in a FIFO buffer;
   providing a bias signal to an RF power amplifier as a function of the digital representation of the power of the baseband digital data such that the bias signal is in an on or off state; and
   converting the baseband digital data to RF, and providing it to the RF power amplifier.

13. A method of controlling an RF power amplifier comprising:
   providing a bias signal to the RF power amplifier for normal operation;
   detecting the magnitude of baseband input signal to be amplified by the RF power amplifier buffering a digital representation of the baseband input signal in a FIFO buffer; buffering a digital representation of the magnitude of the input signal in a FIFO buffer; and
   maintaining the bias signal relatively static when the magnitude of the input signal is above a predetermined threshold, and removing the bias signal when the magnitude of the input signal falls below the predetermine threshold.

* * * * *

UNITED STATES PATENT AND TRADEMARK OFFICE
CERTIFICATE OF CORRECTION

PATENT NO. : 6,714,071 B1  
DATED : March 30, 2004  
INVENTOR(S) : Page

Page 1 of 1

It is certified that error appears in the above-identified patent and that said Letters Patent is hereby corrected as shown below:

Title page,
Item [56], References Cited, OTHER PUBLICATIONS, "Kelley et al." reference, delete "Multibai" and insert -- Multiband --, therefor; and after "2-5," insert -- 1994 --.

Column 3,
Line 55, insert -- : -- before "buffering".
Line 56, after "buffer" delete ":".
Line 60, after "amplifier" insert -- ; --.
Line 62, after "buffer" delete ";".

Column 4,
Line 32, delete "represent" and insert -- representation --, therefor.
Line 38, delete "a" and insert -- an --, therefor.
Line 54, after "amplifier" insert -- ; --.
Lines 61-62, delete "predetermine" and insert -- predetermined --, therefor.

Signed and Sealed this

Seventh Day of September, 2004

JON W. DUDAS
*Director of the United States Patent and Trademark Office*